United States Patent

Arimura et al.

[11] Patent Number: 5,939,956
[45] Date of Patent: Aug. 17, 1999

[54] MULTIPLE-MODE PIEZOELECTRIC FILTER WITH ACOUSTIC AND ELECTROMAGNETIC SEPARATION BETWEEN STAGES

[75] Inventors: Hiroyuki Arimura; Kimonori Kawano, both of Hyogo, Japan

[73] Assignee: Daishinku Corporation, Kakogawa, Japan

[21] Appl. No.: 08/809,142

[22] PCT Filed: Jul. 26, 1996

[86] PCT No.: PCT/JP96/02125

§ 371 Date: Mar. 25, 1997

§ 102(e) Date: Mar. 25, 1997

[87] PCT Pub. No.: WO97/05699

PCT Pub. Date: Feb. 13, 1997

[30] Foreign Application Priority Data

Jul. 27, 1995 [JP] Japan .................................. 7-192142
Sep. 13, 1995 [JP] Japan .................................. 7-235474

[51] Int. Cl.⁶ .............................. H03H 9/09; H03H 9/10; H03H 9/54
[52] U.S. Cl. ........................ 333/189; 310/321; 310/326; 310/353; 310/360; 333/119; 333/192
[58] Field of Search ................. 333/186–192; 310/320, 321, 326, 348, 349, 352, 353, 366, 360

[56] References Cited

U.S. PATENT DOCUMENTS

| | | | |
|---|---|---|---|
| 4,234,860 | 11/1980 | Schumacher et al. | 333/191 X |
| 4,365,181 | 12/1982 | Yamamoto | 310/348 X |
| 5,382,929 | 1/1995 | Inao et al. | 333/187 |
| 5,572,082 | 11/1996 | Sokol | 333/192 X |
| 5,608,362 | 3/1997 | Nishimura et al. | 333/186 X |
| 5,670,919 | 9/1997 | Gamo | 333/189 |

FOREIGN PATENT DOCUMENTS

| | | |
|---|---|---|
| 52-152636 | 11/1977 | Japan . |
| 56-17710 | 2/1981 | Japan . |
| 56-137519 | 10/1981 | Japan . |
| 57-43383 | 9/1982 | Japan . |
| 59-23910 | 2/1984 | Japan .................................. 333/191 |
| 6-6175 | 1/1994 | Japan . |
| 2 100 950 | 1/1983 | United Kingdom ............ 333/191 |

*Primary Examiner*—Benny Lee
*Assistant Examiner*—Barbara Summons
*Attorney, Agent, or Firm*—Nikaido Marmelstein Murray & Oram LLP

[57] ABSTRACT

In a multiple-stage-connected multiple-mode piezoelectric filter unit having a single container 1 in which there are connected, in cascade, two multiple-mode piezoelectric filter elements comprising at least one piezoelectric substrate and two electrode groups each comprising a pair of input/output electrodes and a grounding electrode, the electrode pairs being formed on one side of the piezoelectric substrate with a predetermined gap provided and the grounding electrodes being formed on the other side of the piezoelectric substrate at positions respectively opposite to the electrode pairs, it is an object of the present invention to enhance the ability of preventing the two filter elements from being coupled with each other, thus facilitating the final adjustment thereof. Formed in a single container 1 are two piezoelectric substrates 2, 3 on each of which formed are a pair of input/output electrodes and a grounding electrode. All the electrodes except for the grounding electrodes 23, 33 on the piezoelectric substrates 2, 3 are respectively connected to connection terminals 11 to 16 independently formed on the container 1.

35 Claims, 12 Drawing Sheets

→ FREQUENCY

→ FREQUENCY

MULTIPLE-MODE PIEZOELECTRIC FILTER WITH ACOUSTIC AND ELECTROMAGNETIC SEPARATION BETWEEN STAGES

TECHNICAL FIELD

The present invention relates to a multiple-mode piezoelectric filter using a piezoelectric substrate, and more particularly to a multiple-stage-connected multiple-mode piezoelectric filter unit.

BACKGROUND ART

A piezoelectric filter using a thickness-shear vibration of a piezoelectric substrate or the like is generally arranged such that the piezoelectric substrate is provided on one surface thereof with a pair of input/output electrodes (split electrodes) with a predetermined gap provided, and on the other surface thereof with a grounding electrode opposite to the pair of input/output electrodes. For example, when such a piezoelectric filter is to be incorporated in a communication device or the like, the following structure is often adopted in order to simplify the mounting process or the like. That is, the piezoelectric filter is inserted in a container of the surface mounting type made of ceramics or the like and the piezoelectric substrate is supported in the container at such a suitable position as not to prevent the piezoelectric substrate from being vibrated.

To assure high attenuation characteristics, a plurality of such piezoelectric filters are required to be connected in cascade in multiple stages. However, when a plurality of piezoelectric filters each housed in one surface-mounting-type container are connected in multiple stages, this results in increase in mounting surface. This contributes to the failure to make the device in a compact design.

To overcome the problem above-mentioned, there is conventionally proposed and put in practical use a so-called multiple-stage-connected multiple-mode piezoelectric filter unit in which two electrode groups each comprising a pair of input/output electrodes and a grounding electrode, are formed on one piezoelectric substrate and two piezoelectric filters are substantially formed on a single piezoelectric substrate and housed in a single container.

Such a multiple-stage-connected multiple-mode piezoelectric filter unit is finished as a product by connecting the output electrode of one electrode group, out of two electrode groups formed on the piezoelectric substrate, to the input electrode of the other electrode group. However, when one electrode group is excited, the other electrode group also resonates due to the acoustic and electromagnetic coupling between the electrode groups. It is therefore substantially impossible to independently adjust the respective filters, causing the final product to be adjusted with much difficulty.

In this connection, a variety of proposals have been made as follows. In a piezoelectric substrate at its position where two electrode groups are partitioned, a slit is formed to alleviate the acoustic coupling between the electrode groups, and an electromagnetism intercepting material is secured to the container and passes through the slit to prevent the electromagnetic coupling between the electrode groups (Japanese Patent Laid-Open Publication No. 59-24910). To partition the two electrode groups on the same piezoelectric substrate, an intercepting groove is formed in the piezoelectric substrate by cutting the same from a peripheral edge thereof and a band-like metallic layer is disposed on each of both sides of the intercepting groove (Japanese Patent Publication No. 57-56810). On a piezoelectric substrate at its position where two electrode groups are partitioned, a linear electrode to be connected to a grounding electrode is formed and a damping material such as silver paste or the like is applied on the linear electrode (Japanese Patent Laid-Open Publication No. 61-17826).

However, none of these proposals provides a sufficient ability of preventing the acoustic and electromagnetic coupling between the electrode groups. Thus, the final adjustment is disadvantageously still difficult.

Recently, in a communication device, particularly, a portable-type communication device, it is increasingly required to minimize the mounting area of each of the incorporated circuit elements. Accordingly, as a multiple-stage-connected multiple-mode piezoelectric filter unit, too, there is required a structure in which a small container of the surface mounting type houses an element having two electrode groups formed on a small-area piezoelectric substrate. However, when a piezoelectric substrate having two electrode groups formed thereon is housed in a small container, the distance between these two electrode groups is very small in the structure according to each of the proposals above-mentioned. It is therefore difficult to avoid interferences of the lines of electric force generated based on the electric fields formed by two pairs of input/output electrodes. Disadvantageously, this not only provides poor guarantee attenuation characteristics but also makes the final adjustment difficult due to electromagnetic coupling resulting from the lines of electric force.

In view of the foregoing, the present invention is proposed with the main object of providing, in a multiple-stage-connected multiple-mode piezoelectric filter unit, a piezoelectric filter which is higher in the ability of preventing the acoustic and electromagnetic coupling between the electrode groups than each of the proposals of prior art, thus facilitating the final adjustment of the filter.

It is another object of the present invention to provide a piezoelectric filter in which, even though the mounting area is minimized to cause the two electrode groups to get near each other, the influences of lines of electric force from the electrode groups are hardly exerted, such that the piezoelectric filter is small in size and easy in final adjustment and capable of exhibiting excellent guarantee attenuation characteristics.

DISCLOSURE OF THE INVENTION

To achieve the objects above-mentioned, a first invention is characterized in that a single container houses two piezoelectric substrates each provided with a pair of input/output electrodes and a grounding electrode and that all the electrodes, or those except for the grounding electrodes, on the piezoelectric substrates are respectively connected to connection terminals independently formed on the container.

According to the arrangement of the first invention, the piezoelectric substrates in the container are perfectly separated from each other and the input/output electrodes are respectively connected, in the container, to the corresponding connection terminals. It is therefore possible to adopt the steps of incorporating, in the container, two piezoelectric filters each having a piezoelectric substrate and an electrode group formed thereon, finally adjusting the respective piezoelectric filters as incorporated in the container and connecting these piezoelectric filters in cascade, thus causing the filters to be connected in multiple stages. Thus, there can readily be obtained a highly efficient multiple-stage-connected multiple-mode piezoelectric filter unit having the desired characteristics. In this filter unit under use, the two piezoelectric substrates are perfectly separated from each other, thus preventing the two piezoelectric filters from being acoustically coupled with each other.

Preferably, that connection terminal of the container connected to the output electrode on one piezoelectric substrate, is connected, inside of the container, to that connection terminal of the container connected to the input electrode on the other piezoelectric substrate with conductive adhesives or a bonding wire. In such an arrangement, the wiring outside of the container is the same as that in a conventional multiple-stage-connected multiple-mode piezoelectric filter unit in which two electrode groups are formed on a single piezoelectric substrate and in which the output electrode of one electrode group is connected, on the piezoelectric substrate, to the input electrode of the other electrode group. This requires no special step or wiring when actually mounting the filter unit.

Preferably, the grounding electrodes on the piezoelectric substrates are respectively connected to connection terminals independently formed on the container. Such an arrangement perfectly prevents the piezoelectric substrates from interfering with each other.

Preferably, the two piezoelectric substrates are housed in the container with the center line between the input/output electrodes of one pair positionally shifted from the center line between the input/output electrodes of the other pair. This further improves the effect of cutting off the electromagnetic coupling between the two piezoelectric filters.

To achieve the objects above-mentioned, a second invention has another arrangement characterized in that two electrode groups each comprising a pair of input/output electrodes and a grounding electrode are formed on a single piezoelectric substrate and that the piezoelectric substrate is connected, between the two pairs of input/output electrodes, to the container with a material (damping material) different in acoustic impedance from the piezoelectric substrate.

The arrangement of the second invention is the same as a conventional multiple-stage-connected multiple-mode piezoelectric filter unit in that two electrode groups are formed on a single piezoelectric substrate and that a damping member is disposed between these electrode groups. According to the second invention, however, the damping member disposed between the two electrode groups is connected to the container in which the piezoelectric substrate is housed. Accordingly, at that position of the piezoelectric substrate that the damping member is disposed, vibration hardly propagates due to the anchor effect with respect to the container, thus further improving the vibration attenuation effect by the damping member. This further securely prevents the electrode groups from being acoustically coupled with each other.

According to the second invention, the piezoelectric substrate may be provided, on its side having the two pairs of input/output electrodes formed thereon, with another grounding electrode for partitioning the two pairs of input/output electrodes, and this grounding electrode and the container may be connected to each other with a conductive material (conductive damping material) different in acoustic impedance from the piezoelectric substrate. According to such an arrangement, the two pairs of input/output electrodes are electromagnetically separated from each other. This exhibits an excellent ability of preventing not only the acoustic coupling above-mentioned but also the electromagnetic coupling between the electrode groups.

Preferably, this grounding electrode for partitioning the two pairs of input/output electrodes has a pattern which projects toward the center of each of the pairs of input/output electrodes, and the width of each of the projecting portions of the pattern is smaller in the direction toward each of the pairs of input/output electrodes. According to such an arrangement, the vibration generated at and propagating from one electrode group toward the other electrode group is efficiently absorbed by the mass addition effect of the grounding electrode of which mass is greater as the grounding electrode is remoter from the vibration starting point. Further, the vibration is damped by the conductive damping material and the container, yet there's not prevented vibration from propagating in each electrode pair from the input electrode thereof to the output electrode thereof.

To achieve the objects above-mentioned, a third invention has a further arrangement characterized in that two electrode groups each comprising a pair of input/output electrodes and a grounding electrode are formed on a single piezoelectric substrate; that there are formed, at a position where the two electrode groups are partitioned, a notch, a slot, a plurality of holes or a groove, the notch, slot and holes passing through the piezoelectric substrate and the groove being formed in at least that side of the piezoelectric substrate on which the pairs of input/output electrodes are being formed; and that an elastic material is embedded in the notch, the slot, the plurality of holes or the groove.

According to the arrangement of the third invention, the two electrode groups are formed on the single piezoelectric substrate and partitioned by the notch or the like, and the elastic material is embedded inside of the notch or the like. This further improves the effect of damping the vibration propagating between the electrode groups and the ability of preventing the acoustic coupling as compared with a conventional multiple-stage-connected multiple-mode piezoelectric filter unit.

According to the arrangement of the third invention, when the elastic material embedded inside of the notch or the like, is connected to the container, the vibration attenuation effect is further improved.

Preferably, the elastic material is a conductive material, and this conductive elastic material is connected to a grounding connection terminal formed on the container. According to such an arrangement, the electromagnetic coupling between the electrode groups is also intercepted.

According to each of the second and third invention of the two pairs of input/output electrodes may be disposed at right angles to each other on the piezoelectric substrate. Such an arrangement reduces the influences of lines of electric force between the electrode groups. This not only further improves the electromagnetic coupling preventing ability, but also restrains the guarantee attenuation characteristics from being lowered due to the influences of the lines of electric force when the filter unit is under use.

To achieve the objects above-mentioned, a fourth invention has still another arrangement characterized in that two electrode groups each comprising a pair of input/output electrodes and a grounding electrode are formed on a single piezoelectric substrate, that the piezoelectric substrate is a rectangular crystal element and has the sides which do not extend along the x- and z'-axes, that the pairs of input/output electrodes are formed with a gap extending along the x- or z'-axis, and that the input/output electrodes are connected, by outgoing electrode patterns having the same length, to connection pads formed at sides of the piezoelectric substrate.

According to the arrangement of the fourth invention, the pairs of input/output electrodes can be disposed such that the outgoing electrode patterns have the same length with the center line of one pair of electrodes positionally shifted from the center line of the other pair of electrodes. This restrains the acoustic and electromagnetic coupling between the electrode groups. Further, the outgoing electrode patterns can be equalized in parasitic capacitance, thus facilitating the adjustment.

Any of the arrangements of the second and third inventions may preferably be added to the arrangement of the fourth invention. That is, when any of the arrangements of the second and third inventions is added to the arrangement of the fourth invention, the acoustic and electromagnetic coupling between the two electrode groups can further securely be prevented.

To achieve the objects above-mentioned, a fifth invention is arranged mainly to restrain the interference of lines of electric force between the two electrode groups. That is, the fifth invention provides a multiple-mode piezoelectric filter having a single container in which there are connected, in cascade, two multiple-mode piezoelectric filter elements comprising one or two piezoelectric substrates and two electrode groups each comprising a pair of input/output electrodes and a grounding electrode, the pairs of input/output electrodes being formed on one side of the one or two piezoelectric substrates with a predetermined gap provided, and the grounding electrodes being formed on the other side of the one or two piezoelectric substrates at positions respectively opposite to the pairs of input/output electrodes. The fifth invention is characterized in that two pits adjacent to each other are formed in the container, that the one or two piezoelectric substrates are secured to the container at the peripheral portions of the pits with the pairs of input/output electrodes turned toward the bottom surfaces of the pits, that each of the bottom surfaces of the pits is covered with a conductive material, that a conductive material is disposed along a partition wall formed between the two pits, and that the conductive materials are connected to a grounding connection terminal formed on the container.

To achieve the objects above-mentioned, a sixth invention is arranged, likewise the fifth invention, to restrain the interference of lines of electric force between the two electrode groups. That is, the sixth invention provides a multiple-mode piezoelectric filter having a single container in which two multiple-mode piezoelectric filter elements similar to those in the fifth invention are housed. The sixth invention is characterized in that two pits adjacent to each other are formed in the container, that the one or two piezoelectric substrates are secured to the container at the peripheral portions of the pits with the grounding electrodes turned toward the bottom surfaces of the pits, that a lid made of a conductive material is mounted on the container, that a conductive material is disposed along a partition wall formed between the two pits such that the upper end of the conductive material reaches a position at least in the vicinity of the underside of the lid, and that the conductive material and the lid are connected to a grounding connection terminal formed on the container.

According to each of the fifth and sixth inventions, each of the two multiple-mode piezoelectric filter elements may comprise a piezoelectric substrate and an electrode group formed thereon, or the two multiple-mode piezoelectric filter elements may comprise a single common piezoelectric substrate and two electrode groups formed thereon.

According to each of the fifth and sixth inventions, the pairs of input/output electrodes of the two piezoelectric filter elements housed in the single container of the surface mounting type, are mutually electromagnetically separated from each other by the structure of the container itself, thus preventing the interference of the lines of electric force between the electrode groups.

More specifically, the lines of electric force generated based on the electric fields formed by the two pairs of input/output electrodes, exert influences upon the electrode groups through the space adjacent to the surface of the one or two piezoelectric substrates on which the pairs of input/output electrodes are being formed. According to the arrangement of the fifth invention, the one or two piezoelectric substrates forming two piezoelectric filter elements are secured to the container with the pairs of input/output electrodes turned toward the bottom surfaces of the pits formed in the container, the conductive material is disposed on the bottom surface of each pit and along the partition wall between the pits, and these conductive materials are connected to a grounding potential. Accordingly, the lines of electric force from the pairs of input/output electrodes are trapped by the conductive materials, thus restraining the influences of the lines of electric force between the pairs of input/output electrodes. This can effectively electromagnetically separate the two electrode groups from each other.

According to the arrangement of the sixth invention, the one or two piezoelectric substrates forming two piezoelectric filter elements are secured to the container with upside down unlike in the fifth invention, i.e., with the grounding electrodes turned toward the bottom surfaces of the pits. In this case, the lines of electric force from the pairs of input/output electrodes are formed in the space opposite to the pits, i.e., the space under the lid. Accordingly, the lid of the container is made of a conductive material, a conductive material is disposed along the partition wall between the pits, and the conductive material and the lid are connected to the grounding potential. This effectively traps the lines of electric force, thus producing operational effects similar to those in the fifth invention.

According to each of the fifth and sixth inventions, the conductive material along the partition wall between the two pits in the container may be disposed in any of the following specific manners. A plate-like conductive material may be inserted in and along the partition wall, or a conductive material may cover the whole inner wall surface of each of the pits. Further, a plurality of through-holes may be formed in the partition wall, and a conductive material may be embedded in each of such through-holes.

According to each of the fifth and sixth inventions, any of the arrangements of the second, third and fourth inventions may jointly be used when the two piezoelectric filter elements are formed using a single piezoelectric substrate, and the arrangement of the first invention may jointly be used when the two piezoelectric filter elements are formed using two piezoelectric filters.

BRIEF DESCRIPTION OF THE DRAWINGS

FIG. 1 to FIG. 3 show an embodiment of a first invention, in which FIG. 1 is a plan view with the top portion (lid) of a container 1 removed, FIG. 2 is a section view taken along the line b—b in FIG. 1, and FIG. 3 is an enlarged bottom view with the underside (bottom) of the container 1 seen through;

FIG. 5 is a bottom view of another embodiment of the first invention with the underside of the container 1 seen through;

FIG. 6 to FIG. 8 show an embodiment of a second invention, in which FIG. 6 is a plan view with the top portion of a container 1 removed, FIG. 7 is an enlarged section view of main portions taken along the line b—b in FIG. 6, and FIG. 8 is a bottom view with the underside of the container 1 seen through;

FIG. 10 is a bottom view of a further embodiment of the second invention with the underside of the container 1 seen through;

FIG. 11 to FIG. 13 show an embodiment of a third invention, in which FIG. 11 is a plan view with the top portion of a container 1 removed, FIG. 12 is an enlarged section view of main portions taken along the line b—b in FIG. 11, and FIG. 13 is a bottom view with the underside of the container 1 seen through;

FIG. 25 illustrates the effect of the embodiment shown in FIG. 22, in which

BEST MODE FOR CARRYING OUT THE INVENTION

The following description will discuss preferred embodiments of the present invention with reference to the attached drawings.

Figure 1:
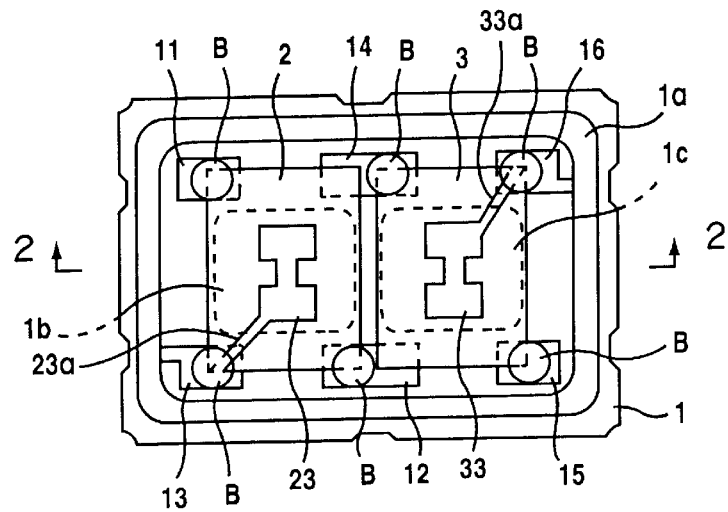
Figure 2:
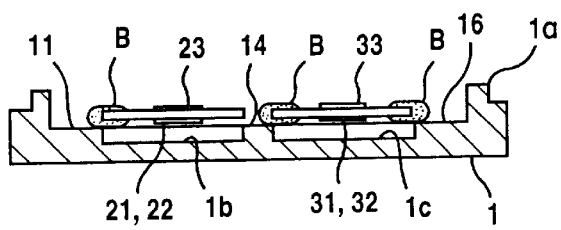
Figure 3:
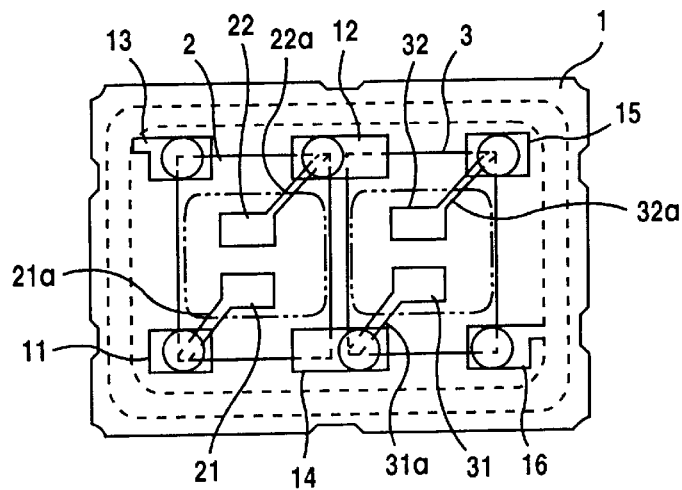

FIG. 1 to FIG. 3 show an embodiment of a first invention. A container 1 of ceramics is provided at the periphery thereof with an upwardly projecting peripheral wall 1a and in the bottom thereof with two pits 1b, 1c. As covering the pits 1b, 1c, two piezoelectric substrates 2, 3 are housed inside of the container 1. Each of the piezoelectric substrates 2, 3 is provided on one side (underside) thereof with an input electrode 21, 31 and an output electrode 22, 32 with a predetermined gap provided, and on the other side thereof with a grounding electrode 23, 33 opposite to the input/output electrodes 21, 22; 31, 32. With the piezoelectric substrates 2, 3 housed in the container 1, a lid (not shown) is put on the peripheral wall 1a such that the container 1 is entirely packaged.

Each of the piezoelectric substrates 2, 3 has sizes of about 2×about 3 mm and is mechanically secured, at three corners thereof, to the container. 1 with conductive adhesives B. Further, with the conductive adhesives B, the electrodes of the piezoelectric substrates 2, 3 are respectively electrically connected to connection terminals (pads) 11 to 16 independently formed on the bottom surface of the container 1.

More specifically, the input electrode 21 and the output electrode 22 at the underside of the piezoelectric substrate 2 are respectively guided to diagonal corners of the piezoelectric substrate 2 by outgoing electrode patterns 21a, 22a and connected to the connection terminals 11, 12 of the container 1 with conductive adhesives B. The grounding electrode 23 on the top side of the piezoelectric substrate 2 is guided to a corner of the piezoelectric substrate 2 by an outgoing electrode pattern 23a and connected to the connection terminal 13 of the container 1 with the conductive adhesives B. Likewise, the input electrode 31 and the output electrode 32 at the underside of the piezoelectric substrate 3 are respectively guided to diagonal corners of the piezoelectric substrate 3 by outgoing electrode patterns 31a, 32a and connected to the connection terminals 14, 15 of the container 1 with conductive adhesives B. The grounding electrode 33 on the top side of the piezoelectric substrate 3 is guided to a corner of the piezoelectric substrate 3 by an outgoing electrode pattern 33a and connected to the connection terminal 16 of the container 1 with the conductive adhesives B. The connection terminals 11 to 16 are connected to external connection terminals for surface mounting (not shown) formed at the underside of the container 1.

Figure 4:
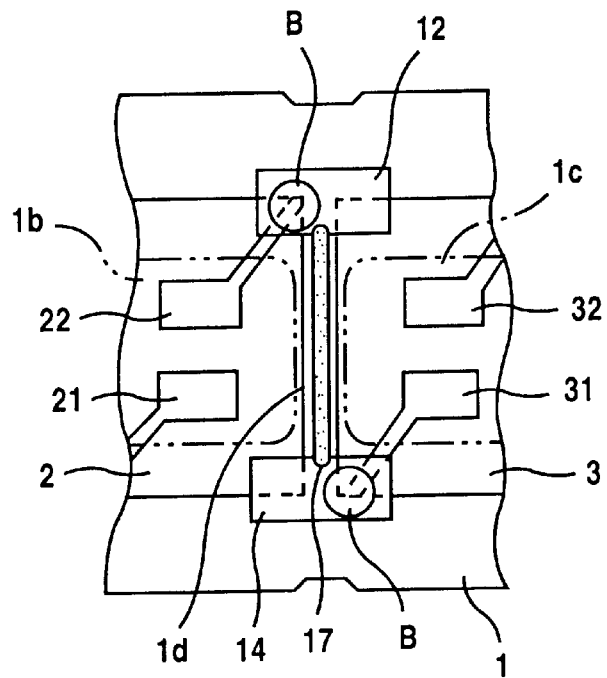
FIG. 4 is an enlarged bottom view of main portions of the embodiment of the first invention with the underside of the container 1 seen through, illustrating an arrangement in which the output electrode 22 of one electrode group and the input electrode 31 of the other electrode group are connected to each other inside of the container 1.

According to the arrangement above-mentioned, the connection terminal 12 connected to the output electrode 22 on one piezoelectric substrate 2 is connected to the connection terminal 14 connected to the input electrode 31 on the other piezoelectric substrate 3, thus providing a multiple-stage-connected multiple-mode piezoelectric filter unit. The connection between the connection terminals 12, 14 may be made outside of the container 1. Alternatively, such a connection may be made inside of the container 1 by disposing therein a bonding wire for connecting the connection terminals 12, 14 or by using conductive adhesives 17 disposed along the top of a partition wall 1d formed between the two pits 1b, 1c as shown in an enlarged bottom view of main portions in FIG. 4. In any case, such a connection is made after each of the piezoelectric substrates 2, 3 has finally been adjusted.

According to the embodiment of the first invention, the two piezoelectric substrates 2, 3 as perfectly separated from each other are housed in the single container 1, and all the electrode groups of the piezoelectric substrates 2, 3 are respectively connected to the connection terminals 11 to 16 independently formed inside of the container 1. Accordingly, the piezoelectric substrates 2, 3 and the electrode groups form two multiple-mode piezoelectric filters. After individually adjusted, these multiple-mode piezoelectric filters can be connected in cascade, thus forming a multiple-stage-connected multiple-mode piezoelectric filter unit. Under use, the respective multiple-mode piezoelectric filters are substantially not acoustically coupled with each other. Accordingly, even made in a compact design and housed in the single container 1, this multiple-stage-connected multiple-mode piezoelectric filter unit of the surface mounting type is easy in adjustment and high in quality with spurious response reduced to increase the guarantee attenuation.

Further, when the output/input electrodes of the piezoelectric substrates 2, 3 are connected within the container 1 using the conductive adhesives 17 or the like, no special consideration is required for connection with an external circuit outside of the container 1, likewise in a normal multiple-stage-connected multiple-mode piezoelectric filter unit of prior art.

In the embodiment above-mentioned, the grounding electrodes 23, 33 of the piezoelectric substrates 2, 3 are respectively independently connected to the connection terminals 13, 16 of the container 1, but may be connected to a common connection terminal of the container 1. However, it has been found that, when the grounding electrodes 23, 33 are respectively independently connected to connection terminals as done in the embodiment above-mentioned, this is more effective in preventing the two piezoelectric filters from being electromagnetically coupled with each other.

Figure 5:
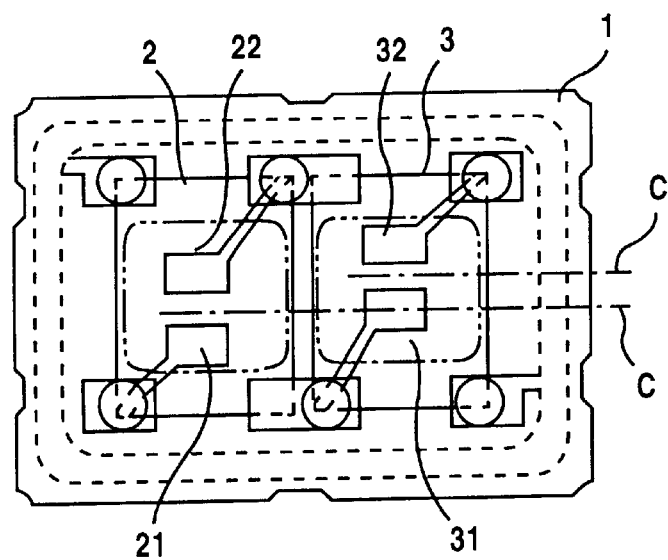

FIG. 5 is a bottom view of another embodiment of the first invention. In FIG. 5, the piezoelectric substrates 2, 3 are housed in the container 1 such that the center line C between the input/output electrodes on the piezoelectric substrate 2 is positionally shifted from the center line C between the input/output electrodes on the piezoelectric substrate 3 (subsequently, the centers of the grounding electrodes are also positionally shifted from each other). Such an arrangement can reduce the influences of lines of electric force between the electrode groups. This is more effective in preventing two multiple-mode piezoelectric filters from being electromagnetically coupled with each other.

The following description will discuss embodiments of a second invention.

Figure 6:
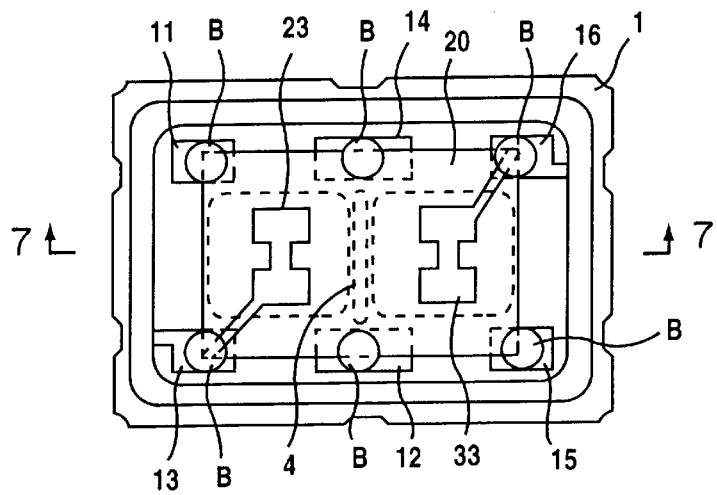
Figure 7:
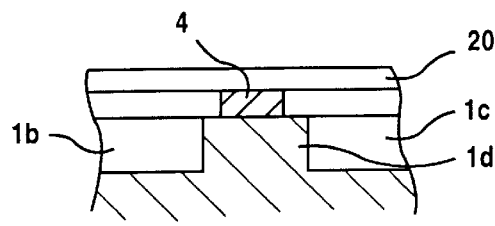
Figure 8:
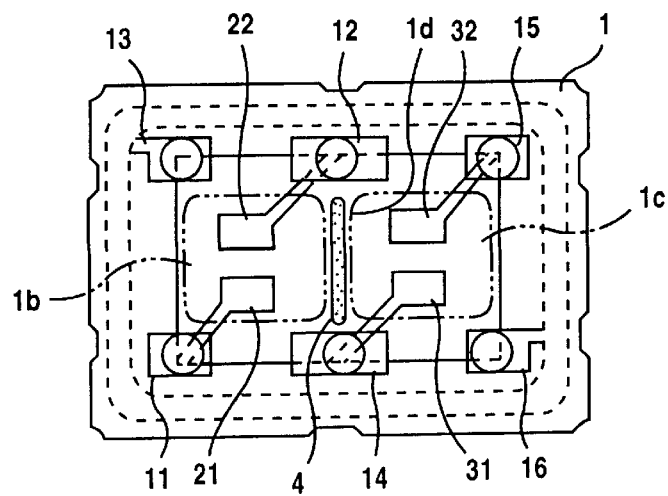

FIG. 6 to FIG. 8 show an embodiment of the second invention. In this embodiment, one piezoelectric substrate 20 is housed in a container 1 equivalent to that in FIG. 1 and has two pairs of input/output electrodes 21, 22 and 31, 32 and grounding electrodes 23, 33 corresponding to the electrodes 21, 22; 31, 32.

The piezoelectric substrate 20 is connected, at total six positions including the four corners thereof and substantially centers of opposite two sides thereof, to the container 1 with conductive adhesives B. Connection terminals (pads) 11 to 16 are formed on the container 1 at the respective connection positions. The electrodes of the two electrode groups are respectively connected to the connection terminals 11 to 16 using outgoing electrode patterns.

This embodiment of the second invention is characterized in that there is disposed, between the two electrode groups, a damping member 4, such as adhesives or the like, made of a material different in acoustic impedance from the piezoelectric substrate 20 and that the piezoelectric substrate 20 and the container 1 are mechanically connected to each other by the damping member 4. More specifically, the damping member 4 connects the top of a partition wall 1d between two pits 1b, 1c of the container 1 to the piezoelectric substrate 20 at its underside at which the pairs of input/output electrodes are being formed.

According to the arrangement above-mentioned, the vibration propagating from one electrode group to the other electrode group, is considerably effectively damped by the damping member 4 of which vibration is regulated by the anchor effect of the container 1 or of which vibration is regulated by the connection to the container 1. This remarkably increases the ability of preventing the electrode groups from being acoustically coupled with each other.

Figure 9:
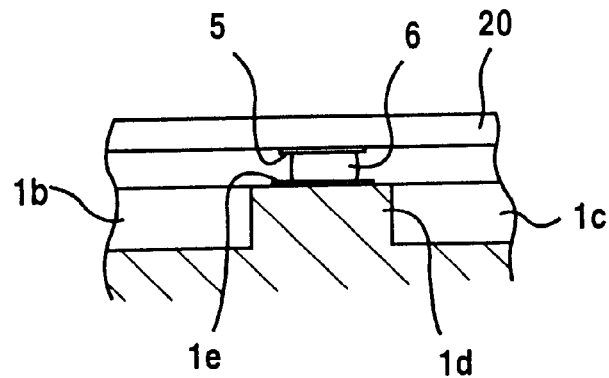
FIG. 9 is an enlarged section view similar to FIG. 7, illustrating another embodiment of the second invention.

FIG. 9 is an enlarged section view similar to FIG. 7, illustrating another embodiment of the second invention.

In the embodiment in FIG. 9, two electrode groups 21, 22, 23 and 31, 32, 33 of a piezoelectric substrate 20 and the arrangement of attaching and connecting the same to a container 1 are similar to those shown in FIGS. 6 to 8. The embodiment in FIG. 9 is characterized in that another grounding electrode 5 different from the grounding electrodes 23, 33 on the top side of the piezoelectric substrate 20, is disposed at the underside thereof to partition the two pairs of input/output electrodes, that the piezoelectric substrate 20 and the container 1 are mechanically connected by a conductive damping member 6 through the grounding electrode 5, and that the grounding electrode 5 is electrically connected to a grounding connection terminal 1e formed on the container 1. As the conductive damping member 6, conductive adhesives may be used for example.

According to the arrangement in FIG. 9, likewise in the embodiment shown in FIGS. 6 to 8, the vibration propagating between the two electrode groups is effectively damped by the conductive damping member 6 of which vibration is regulated by the container 1. Further, the two electrode groups are separated from each other by a conductor of a grounding potential. This effectively cuts off the lines of electric force between the electrode groups, thus preventing the electrode groups from being electromagnetically coupled with each other.

Figure 10:
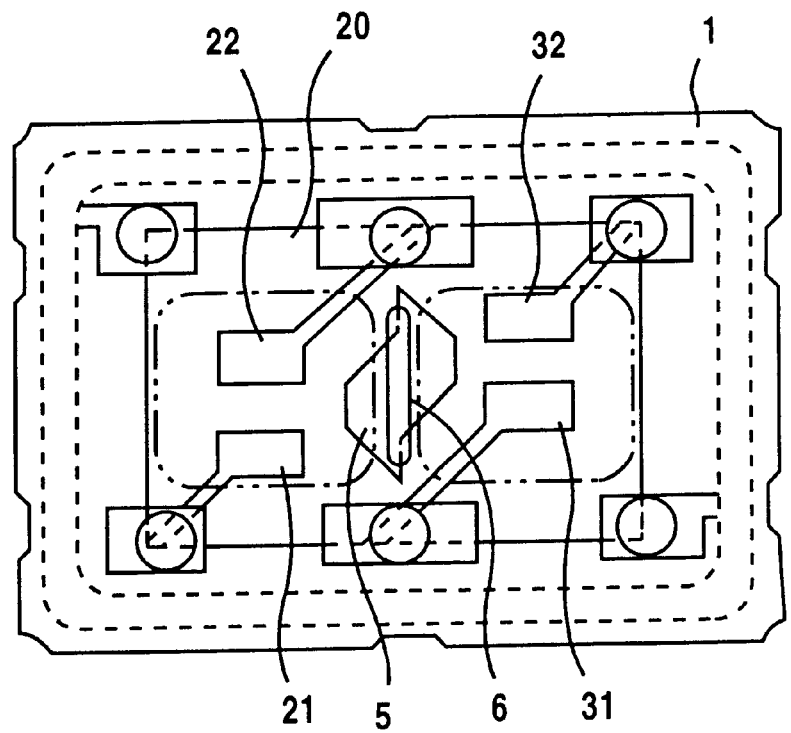

FIG. 10 shows a modification of the embodiment in FIG. 9. and is a bottom view with the underside of the container 1 seen through.

The embodiment in FIG. 10 is the same as that in FIG. 9 in that the grounding electrode 5 disposed at the underside of the piezoelectric substrate 20 is mechanically and electrically connected to the grounding connection terminal 1e (not shown in FIG. 10; See FIG. 9) of the container 1 by the conductive damping member 6. However, the grounding electrode 5 is characterized in its pattern. More specifically, the grounding electrode 5 has a pattern which projects toward the center of each of the pairs of input/output electrodes 21, 22 and 31, 32 and of which width is narrower as each projecting portion gets closer to each electrode pair.

According to the arrangement in FIG. 10, the vibration from one electrode group toward the other electrode group is efficiently absorbed by the mass addition effect of the grounding electrode 5 of which mass is greater as the grounding electrode 5 is remoter from the pair of input/output electrodes serving as the vibration starting point. Further, since the grounding electrode 5 and the container 1 are connected to each other by the conductive damping member 6, the vibration thus absorbed is effectively damped. Further, each projecting portion of the pattern of the grounding electrode 5 is smaller in width as each projecting portion gets closer to each electrode pair. This does not prevent the propagation of vibration from the input electrode toward the output electrode of each electrode pair.

In FIG. 10, the center line between the input/output electrodes of one pair is positionally shifted from the center line between the input/output electrodes of the other pair. However, it is a matter of course that the concept of the grounding electrode pattern shown in FIG. 10 can be applied to the arrangement in which such center lines are not positionally shifted from each other and in which the grounding electrode 5 has a pattern which projects in a transversely symmetrical manner.

Figure 11:
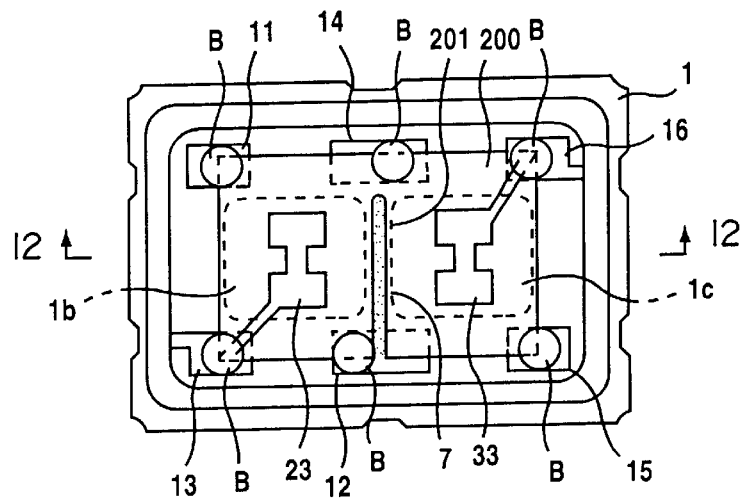
Figure 12:
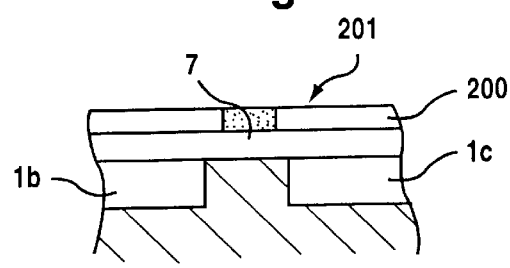
Figure 13:
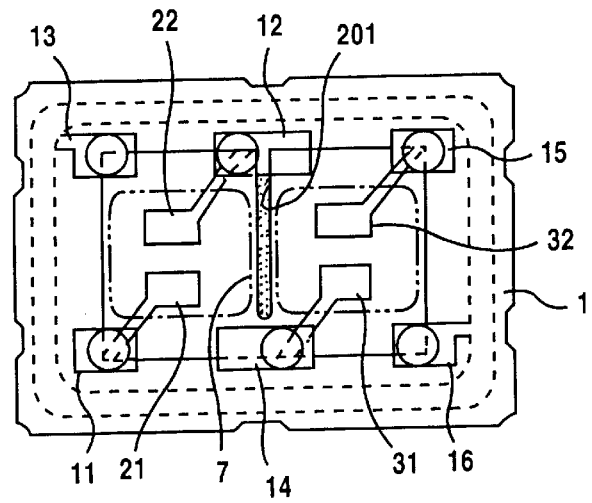

The following description will discuss an embodiment of a third invention with reference to FIG. 11 to FIG. 13.

Likewise each embodiment of the second invention, this embodiment comprises one piezoelectric substrate 200 on which formed are two electrode groups, i.e., a pair of input/output electrodes 21, 22 and a grounding electrode 23 opposite thereto and a pair of input/output electrodes 31, 32 and a grounding electrode 33 opposite thereto. The piezoelectric substrate 200 is mechanically connected, at six portions thereof, to a container 1 with conductive adhesives B, and the electrodes are electrically respectively connected to connection terminals 11 to 16 disposed at the container 1 with the conductive adhesives B.

The embodiment shown in FIG. 11 to FIG. 13 is characterized in that a notch 201 is formed in and passes through the piezoelectric substrate 200 at a position where the two electrode groups are partitioned, the notch 201 extending from one side of the piezoelectric substrate 200 to a position in the vicinity of the opposite side, and in that the notch 201 is filled with an elastic material 7 such as adhesives, other resin or the like.

According to the arrangement above-mentioned, the vibration propagating between the two electrode groups is efficiently damped by the notch 201 and the elastic material 7 therein, thereby to securely prevent the acoustic coupling between the electrode groups.

Figure 14:
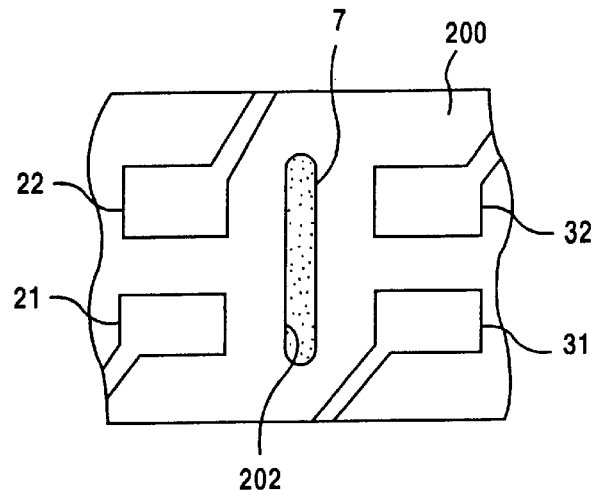
FIG. 14 is a plan view of main portions of another embodiment of the third invention.
Figure 15:
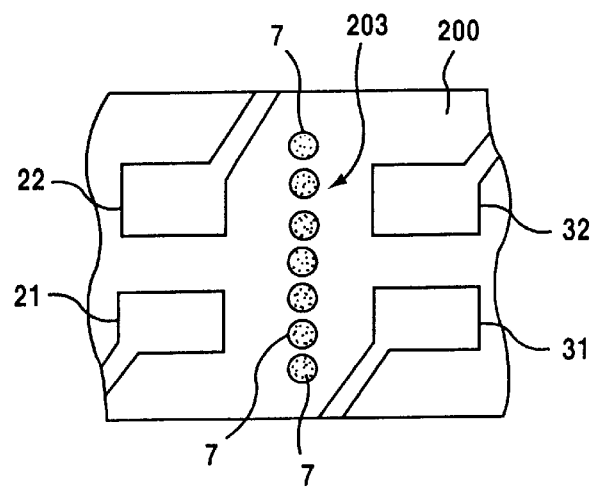
FIG. 15 is a plan view of main portions of a further embodiment of the third invention.
Figure 16:
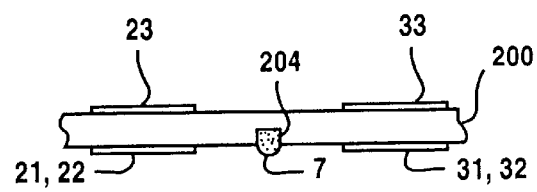
FIG. 16 is a longitudinal section view of main portions of still another embodiment of the third invention.
Figure 17:
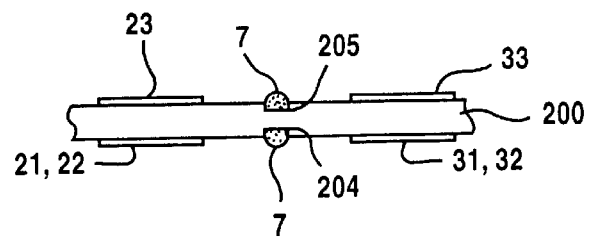
FIG. 17 is a longitudinal section view of main portions of a still further embodiment of the third invention.

According to the third invention, instead of the notch 201 which partitions the two electrode groups, a slot 202 or a plurality of through-holes 203 may be formed at a position which partitions two electrode groups as shown in FIG. 14 or 15. Alternatively, a groove 204 may be formed in the side at which the pairs of input/output electrodes are formed, as shown in FIG. 16, or a groove 205 may additionally be formed in the side opposite to the side above-mentioned, as shown in FIG. 17. In each of the arrangements above-mentioned, each of the slot 202, the through-holes 203 and the grooves 204, 205 may be filled with an elastic material 7. Each of the arrangements above-mentioned can produce the same effect as that in the embodiment in FIG. 11 to FIG. 13.

In each of the embodiments of the third invention shown in FIGS. 11 to 13, FIG. 14, FIG. 15, FIG. 16, the piezoelectric substrate 200 is not necessarily housed in the container 1 of the surface mounting type, but may be used in an optional manner with the same effect produced.

Figure 18:
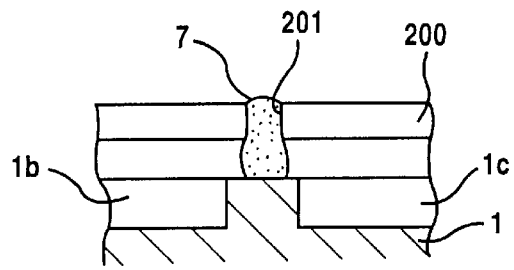
FIG. 18 is a longitudinal section view of main portions of yet another embodiment of the third invention.

According to the third invention, when the piezoelectric substrate 200 is housed in the container 1 of the surface mounting type, the elastic material 7 put inside of the notch 201, the slot 202 or the like, may be so arranged as to project from the underside of the piezoelectric substrate 200 and to reach the container 1 such that the piezoelectric substrate 200 and the container 1 are substantially mechanically connected to each other with the elastic material 7, as shown in FIG. 18. In this case, the vibration of the elastic material 7 is regulated by the connection of the container 1 to the piezoelectric substrate 200, thus further improving the ability of preventing the acoustic coupling between the two electrode groups, likewise in the arrangement of the second invention.

Figure 19:
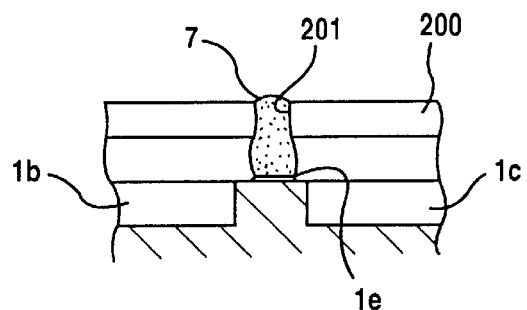
FIG. 19 is a longitudinal section view of main portions of a yet further embodiment of the third invention.

Moreover, in the third invention, as shown in a section view of main portions in FIG. 19, the elastic material 7 filled inside the notch 201 or the slot 202 (FIG. 14) or the like has conductivity of conductive adhesives or the like, and the conductive elastic material 7 is connected to the grounding connection terminal 1e formed in the container 1, thereby making it possible to prevent the acoustic coupling and electromagnetic coupling between the both electrode groups simultaneously, in the same manner as the embodiment of the second invention shown in FIG. 6.

Figure 20:
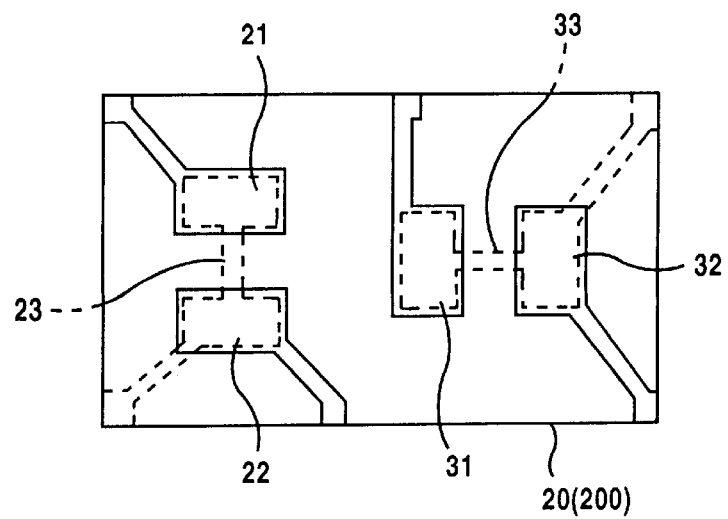
FIG. 20 is a bottom view of the piezoelectric substrate 20 or 200 having another pattern of pairs of input/output electrodes in each of the second and third inventions.

According to the each embodiment of the second invention and the third invention as mentioned above, as FIG. 20 illustrates a bottom view of the piezoelectric substrate by means of extracting the piezoelectric substrate 20 or 200, each pair of input/output electrodes 21, 22 and 31,32 are disposed at right angles to each other on the piezoelectric substrate 20 or 200, thereby reducing the influence of electric lines of force between the each pair of input/output electrodes, thus further improving the ability of preventing the electromagnetic coupling between the respective electrode groups.

Figure 21:
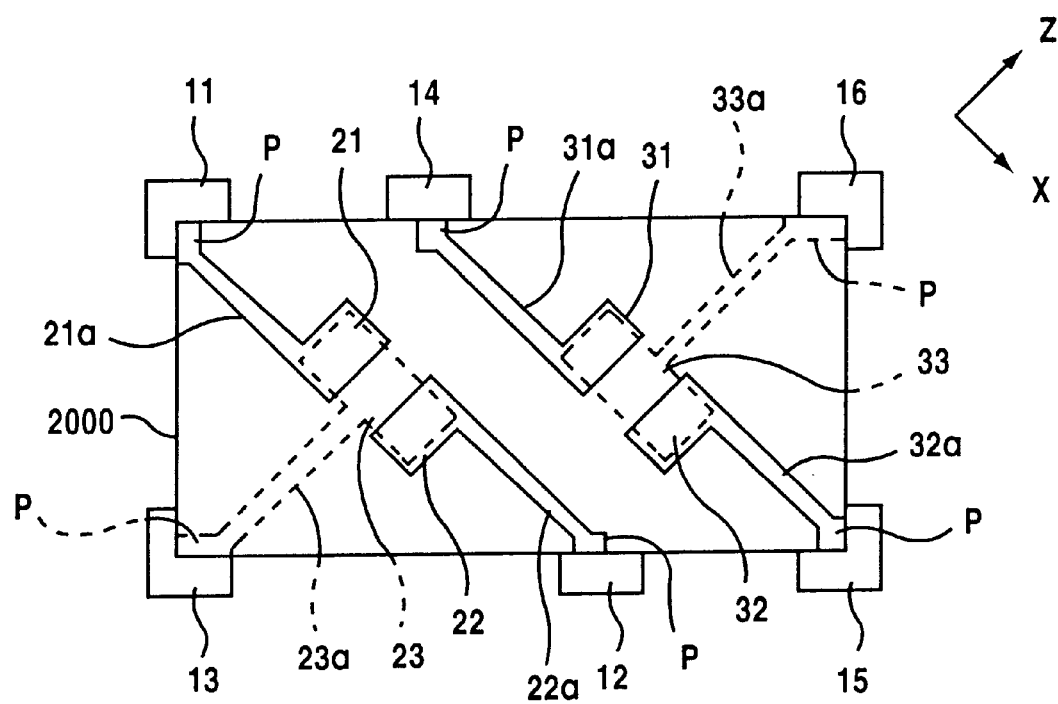
FIG. 21 is a plan view of a crystal element 2000 at its side having pairs of input/output electrodes formed thereon, according to an embodiment of a fourth invention.

The following description will discuss an embodiment of a fourth invention. FIG. 21 is a plan view of a crystal element forming a piezoelectric substrate at its side on which pairs of input/output electrodes are formed.

This embodiment comprises a single rectangular crystal element 2000 serving as a piezoelectric substrate on which formed are two electrode groups, i.e., a pair of input/output electrodes 21, 22 and a grounding electrode 23 opposite thereto and a pair of input/output electrodes 31, 32 and a grounding electrode 33 opposite thereto.

The crystal element 2000 has four sides which are not parallel to its crystal axes x and z', but which are inclined, with respect to these axes, at a predetermined angle for example 45. On the other hand, the pairs of input/output electrodes are disposed with a gap extending along one crystal axis, for example the axis x. Thus, the pairs of electrodes are disposed as inclined, in its entirety, at an angle of 45 with respect to the side of the crystal element 2000. Also, the grounding electrodes 23, 33 are accordingly disposed as inclined at an angle of 45° with respect to the sides of the crystal element 2000. The electrodes are respectively guided to connection pads P formed at edge portions of the crystal element 2000 by outgoing electrode patterns 21a to 33a, and are then connected, at the pads P, to connection terminals (pads) 11 to 16 of the container by conductive adhesives or the like (not shown). Of the outgoing electrode patterns 21a to 33a, the patterns 21a, 22a, 31a, 32a of the pairs of input/output electrodes 21, 22 and 31, 32 have the same length.

According to the arrangement above-mentioned, the center line between the input/output electrodes 21, 22 is not identical with and is inevitably positionally shifted from the center line between the input/output electrodes 31, 32. This restrains the acoustic and electromagnetic coupling between the electrode groups. Further, the input/output electrodes are guided to external circuits such as connection terminals of the container through the outgoing electrode patterns having the same length. This equalizes the parasitic capacitances generated in the pairs of input/output electrodes. This advantageously facilitates to match the filter characteristics to each other, thus facilitating the final adjustment.

When the arrangement of the fourth invention shown in FIG. 21 is combined with any of the embodiments of the second and third inventions, this further improves the ability of preventing the electrode groups from being acoustically and electromagnetically coupled with each other. Further, the parasitic capacitances generated in the electrode groups can be equalized.

Also, the arrangement of the fourth invention may be combined with the arrangement of the first invention. More specifically, two piezoelectric substrates each having an electrode group are disposed in one container, each piezoelectric substrate has the sides inclined with respect to the crystal axes, each electrode group is disposed along a crystal axis direction, and the outgoing electrode patterns are equal in length as done in the embodiment in FIG. 21. In this case, in addition to the effects produced by the first invention, there are produced, substantially as they are, the effects produced by the fourth invention such as equalization of parasitic capacitances and restraint of electromagnetic coupling due to the positional shift of the center lines of the input/output electrodes on the piezoelectric substrates.

Figure 22:
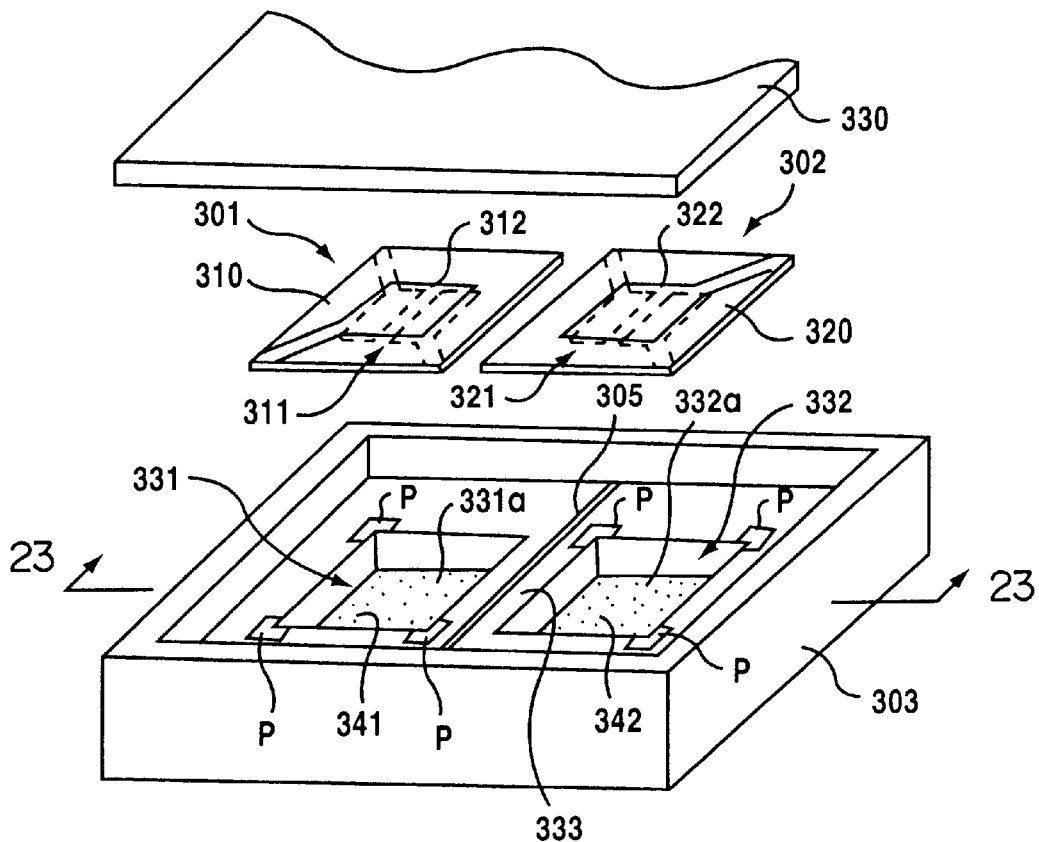
FIG. 22 is an exploded perspective view of a embodiment of a fifth invention.
Figure 23:
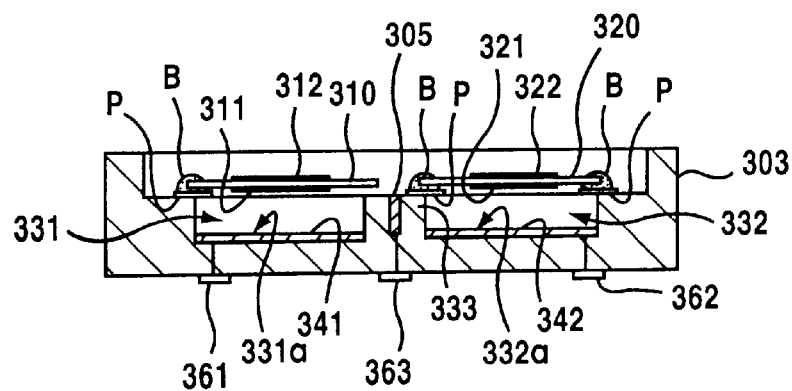
FIG. 23 is a section view, taken along the line A—A in FIG. 22, with the lid 330 removed.

The following description will discuss a fifth invention. FIG. 22 is an exploded perspective view of an embodiment of the fifth invention, and FIG. 23 is a section view taken along the line A—A in FIG. 22 with a lid 330 removed.

Two piezoelectric filter elements 301, 302 are housed in a single container 303 of the surface mounting type, and a lid 330 is placed on the upper edge of the container 303 such that the elements 301, 302 are hermetically closed. In this embodiment, each of the piezoelectric filter elements 301, 302 has a piezoelectric substrate 310, 320 which is provided on one side thereof with pairs of input/output electrodes 311, 321 and on the other side thereof with a grounding electrode 312, 322.

The container 303 is made of ceramics for example and provided in the bottom thereof with two pits 331, 332 adjacent to each other. Each of the piezoelectric filter element 301, 302 is connected, at three corner portions thereof, to peripheral portions of the pit 331, 332 as covering the pit 331, 332, with the pairs of input/output electrodes 311, 321 turned toward a bottom 331a, 332a of the pit 331, 332.

More specifically, each pair of input/output electrodes 311, 321 and the grounding electrode 312, 322 of the piezoelectric substrate 310, 320 are guided to three corner portions of the piezoelectric substrate 310, 320 by corresponding outgoing electrode patterns. The container 303 has total six connection pads P on peripheral portions of the pits 331, 332 at positions corresponding to the corner portions above-mentioned. The piezoelectric substrate 310, 320 is mechanically connected to the connection pads P at the three corner portions without the conductive adhesives B preventing the piezoelectric substrate 310, 320 from vibrating. Further, the input/output electrodes 311, 321 and the grounding electrodes 312, 322 are respectively electrically connected to the connection pads P. The connection pads P pass through the container 303 and are connected to external connection pads for surface mounting (not shown) which are formed at the underside of the container 303. The piezoelectric filter elements 301, 302 may be connected in cascade through the external connection pads or within the container 303.

The bottom surfaces 331a, 332a of the pits 331, 332 are coated as metallized with conductive materials 341, 342 made of an alloy of W and Au for example. A platelike conductive material 305 is inserted, as partitioning the pits 331, 332, in the center of a partition wall 333 interposed between the two pits 331, 332. The conductive materials 341, 342, 305 pass through the container 303 and are connected to dedicated grounding connection pads 361 to 363 formed at the underside of the container 303.

Figure 24:
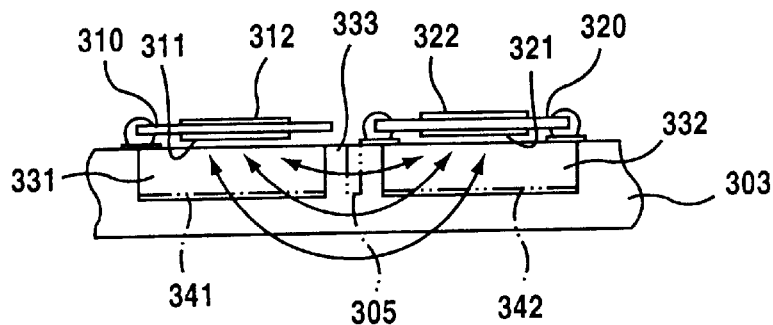
FIG. 24 illustrates the operation of the embodiment shown in FIG. 22.

According to the embodiment above-mentioned, the lines of electric force from one pair of input/output electrodes do not influence the other pair of input/output electrodes. More specifically, as schematically shown in FIG. 24, when the conductive materials 341, 342, 305 are not disposed, two pairs of input/output electrodes 311, 321 interfere with each other by the influences of lines of electric force formed, based on the electric fields formed by the electrode pairs 311, 321, in the space adjacent to the surfaces on which the electrode pairs 311, 321 are being formed. However, when the conductive materials 341, 342, 305 of a grounding potential are interposed in the space where the lines of electric force are being generated, this restrains the lines of electric force from one pair of electrodes from exerting an influence to the other pair of electrodes.

Figure 25A:
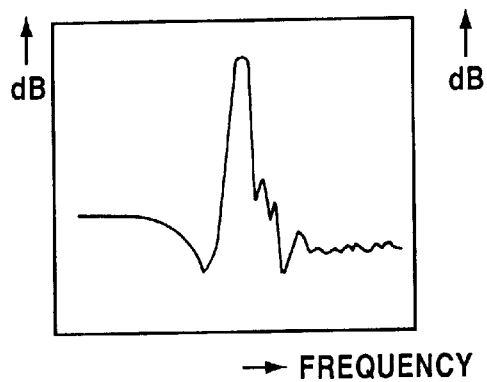
FIG. 25a is a graph illustrating the characteristics of a filter of a comparative example with the conductive materials 341, 342, 304 removed from the embodiment in FIG. 22.
Figure 25B:
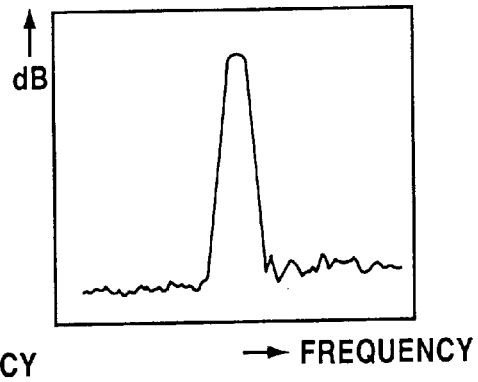
FIG. 25b is a graph illustrating the characteristics of a filter according to the embodiment of the fifth invention with the conductive materials 341, 342, 304 attached.

Thus, a multiple-stage-connected multiple-mode piezoelectric filter unit with the conductive materials 341, 342, 305 removed from the arrangement shown in FIGS. 22, 23, exhibits the frequency characteristics as shown in FIG. 25a, and a multiple-stage-connected multiple-mode piezoelectric filter unit with the conductive materials 341, 342, 305 disposed, exhibits excellent guarantee attenuation characteristics as shown in FIG. 25b.

In the embodiment above-mentioned, the conductive materials 341, 342, 305 are respectively connected to the dedicated grounding connection pads 361 to 363, but may be connected to one another at a suitable portion of the container 303 and then connected to a common grounding connection pad.

Figure 26:
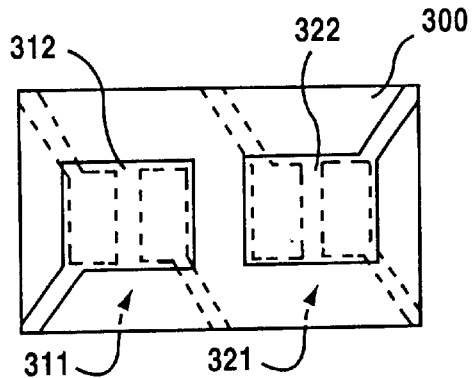
FIG. 26 is a front view of another arrangement of the piezoelectric filter elements 301, 302 according to the fifth invention.

In the embodiment above-mentioned, each of the two piezoelectric filter elements 301, 302 has a predetermined electrode group which is formed on each of the piezoelectric substrates 310, 320. Alternatively, as shown in FIG. 26, a single piezoelectric substrate 300 may be provided on one side thereof with pairs of input/output electrodes 311, 321 and at the other side thereof with grounding electrodes 312, 322. In this case, the piezoelectric substrate 300 may be secured, at total six portions thereof, to total six connection pads P of the container 303 at peripheral portions of the pits 331, 332, likewise in the embodiment shown in FIGS. 22, 23.

According to the embodiment above-mentioned, as the conductive material along the partition wall 333 between the two pits 331, 332, the plate-like conductive material 305 is inserted into the partition wall 333. However, according to the fifth invention, the conductive material 305 may be formed as shown in each of FIGS. 27 and 28 which are perspective views, with portion broken away, of a container 303.

Figure 27:
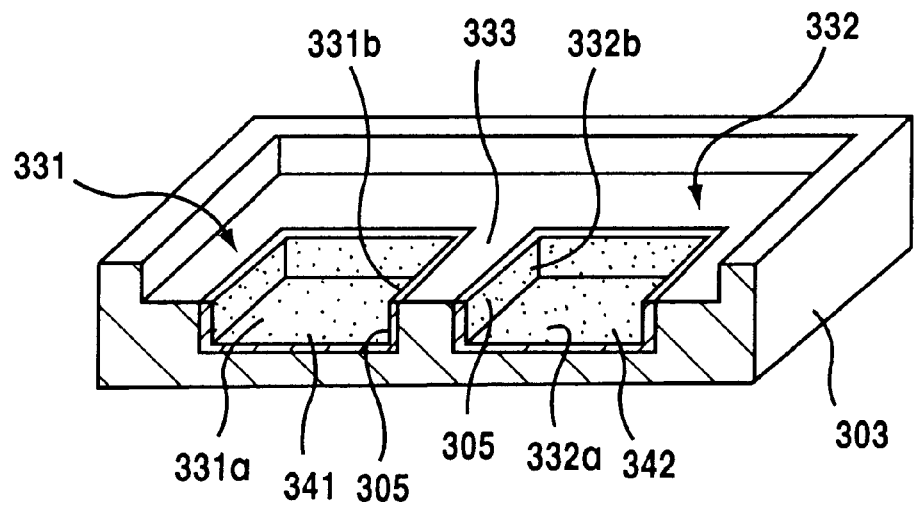
FIG. 27 is a perspective view, with portions broken away, of another disposition of the conductive material 305 according to the fifth invention.

In an example shown in FIG. 27, the inner wall surfaces 331b, 332b of the two pits 331, 332 of the container 303 are coated with conductive materials 305. In such an arrangement, the pits 331, 332 are coated at the whole inner surfaces thereof with conductive materials including conductive materials 341, 342 which coat the bottom 331a, 332a of the pits 331, 332. It is enough that the conductive materials 305 coat at least both sides of the partition wall 333 out of the inner wall surfaces 331b, 332b of the pits 331, 332. However, not only the both sides of the partition wall 333 but also the surfaces at right angles thereto may be coated. In this case, there can suitably be eliminated the influences, upon external circuits, of the lines of electric force generated by the electric fields of the pairs of input/output electrodes 311, 321. Further, a similar conductive material may be formed also on the top of the partition wall 333 and the conductive materials 341, 342, 305 in the pits 331, 332 may be connected to one another. In this case, all the conductive materials 341, 342, 305 can be grounded using a single grounding connecting pad.

Figure 28:
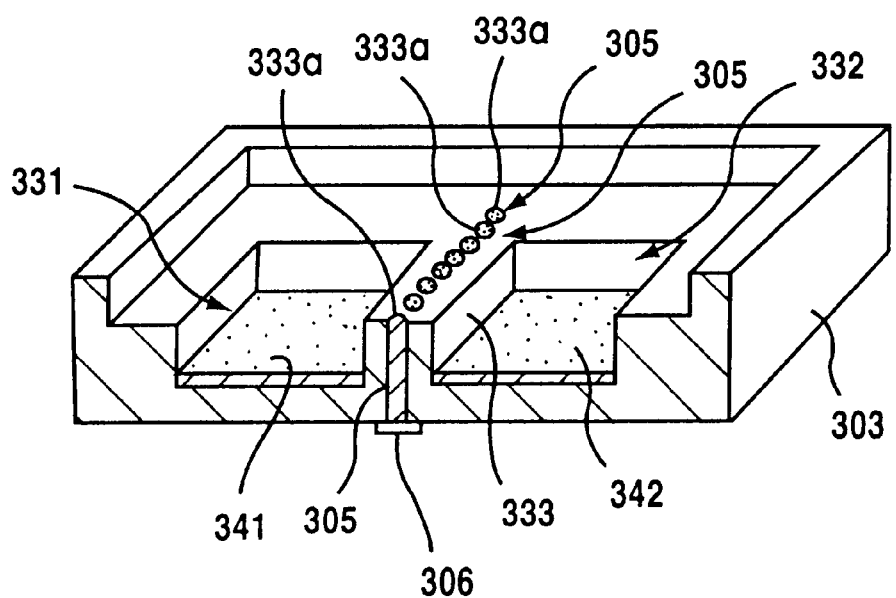
FIG. 28 is a perspective view, with portions broken away, of a further disposition of the conductive material 305 according to the fifth invention.

In an example shown in FIG. 28, a plurality of through-holes 333a are formed along and in the partition wall 333 between the two pits 331, 332 of the container 303, and a conductive material 305 is embedded in each of the through-holes 333a and connected to a common grounding connection pad 306 formed at the underside of the container 303.

In each of the examples in FIGS. 27 and 28, the piezoelectric substrates are secured in the same manner as that in the embodiment shown in FIGS. 22 and 23. Thus, it has been made sure that each of the arrangements in FIGS. 27 and 28 produces effects similar to those produced by the embodiment in FIGS. 22 and 23.

Figure 29:
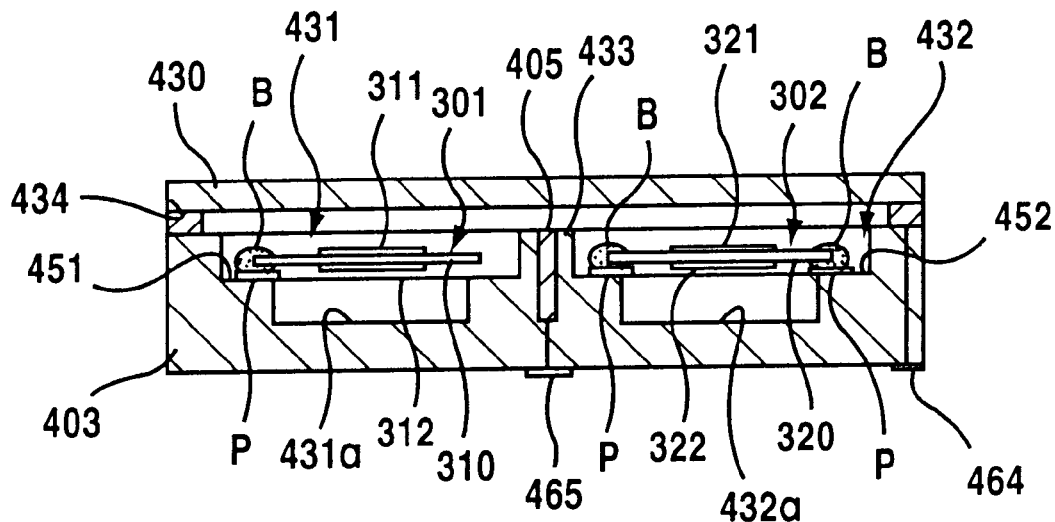
FIG. 29 is a longitudinal section view of an embodiment of a sixth invention.

The following description will discuss an embodiment of a sixth invention with reference to a longitudinal section view in FIG. 29.

The sixth invention has an arrangement in which the piezoelectric substrates are secured in the container upside down unlike in the fifth invention. In an embodiment in FIG. 29, two piezoelectric filter elements 301, 302 are the same as those shown in FIGS. 22 and 23, and a container 403 has two pits 431, 432 adjacent to each other as done in each of the embodiments above-mentioned. Each of the pits 431, 432 is provided at a position substantially at a half depth with a flat step portion 451, 452 which extends along the whole inner wall surface of each pit 431, 432. Piezoelectric substrates 310, 320 forming the piezoelectric filter elements 301, 302 are secured, as turned upside down as compared with the arrangement in FIGS. 22, 23, to the step portions 451, 452 of the pits 431, 432 with grounding electrodes 312, 322 turned toward the bottom sides of the pits 431, 432.

More specifically, the embodiment in FIG. 29 is provided at the step portions 451, 452 of the pits 431, 432 with connection pads P equivalent to those shown in FIGS. 22, 23. Likewise in the embodiment in FIGS. 22, 23, the piezoelectric substrates 310 320 are arranged such that pairs of input/output electrodes 311, 321 and the grounding electrodes 312, 322 are electrically connected to and mechanically supported by corresponding connection pads P through conductive adhesives B.

A ring made of a Fe—Ni—Co alloy 434 is secured to the peripheral edge of the top of the container 403, and a metallic lid 430 is secured onto the Fe—Ni—Co alloy ring 434 by a seam welding.

A partition wall 433 disposed between the two pits 431, 432 has the top which reaches a position in the vicinity of the underside of the lid 430. A plate-like conductive material 405 is inserted in the partition wall 433. The top of the conductive material 405 reaches the to of the partition wall 433. Accordingly, the top of the conductive material 405 reaches a position in the vicinity of the underside of the lid 430.

Through the Fe—Ni—Co alloy ring 434, the lid 430 is connected to a grounding connection pad 464 formed at the underside of the container 403, and the conductive material 405 is also connected to a grounding connection pad 465 formed at the underside of the container 403.

According to the arrangement above-mentioned, the lines of electric force generated, based on the electric fields formed by the pairs of input/output electrodes 311, 321, in the space adjacent to the surfaces on which the electrode pairs 311, 312 are being formed, are intercepted by both the conductive material 405 and the metallic lid 430 which are disposed in the space above-mentioned and which are of the grounding potential. Thus, the lines of electric force exert no influences upon the piezoelectric filter elements 301, 302.

According to the sixth invention in which the piezoelectric filter elements 301, 302 are housed in the container 403 with the pairs of input/output electrodes 311, 321 turned upside, the conductive material 405 to be disposed along the partition wall 433 between the two pits 431, 432 may be modified in shape as shown in each of FIGS. 27 and 28.

Figure 30:
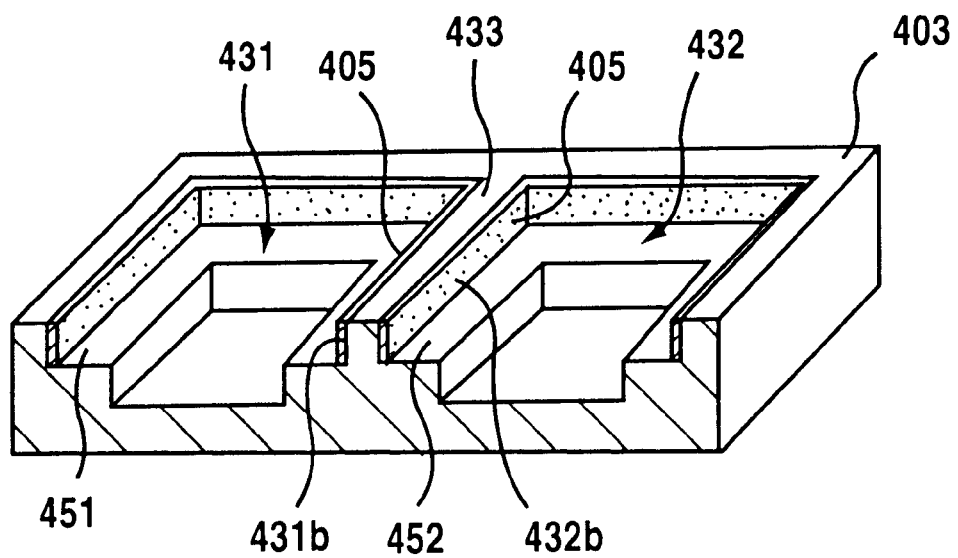
FIG. 30 is a perspective view, with portions broken away, of another disposition of the conductive material 405 according to the sixth invention.

More specifically, as shown in a section view with portions broken away in FIG. 30, the conductive material 405 may be so arranged as to cover those inner wall surfaces 431b, 432b of the two pits 431, 432 which are higher in position than the step portions 451, 452. Such an arrangement may produce operational effects identical with those produced in the embodiment in FIG. 29. In this case, the conductive material 405 covering the inner wall surfaces of the pits 431, 432 may be grounded in the following manner. That is, portions of the conductive material 405 covering the inner wall surfaces of the pits 431, 432 may be extended up to the step portions 451, 452. Then, these portions may be connected to grounding connection pads formed at the underside of the container 403 using through-holes.

Although not shown, instead of the plate-like conductive material 405, a plurality of through-holes in a line may be formed, in the partition wall 433, as partitioning the two pits 431, 432 and the conductive material 405 may be embedded in each of the through-holes, as done in the embodiment in FIG. 28.

In each of the embodiments in FIGS. 29 and 30, the conductive material may also cover not only the bottom surfaces 431a, 432a of the pits 431, 432 but also those inner surfaces thereof which are lower in position than the step portions 451, 452. According to such an arrangement, the inside of the container 403 is preferably electromagnetically shielded with respect to the outside thereof.

Further, in order that a conductive material is embedded in the gap between the conductive material 405 disposed along the partition wall 433 and the metallic lid 430, conductive adhesives may be interposed between the partition wall 433 and the lid 430. Also, instead of such conductive adhesives, the Fe—Ni—Co alloy ring 434 may be made in a ⊟ shape such that the ring 434 is disposed not only on the top peripheral portion of the container 403 but also on the top of the partition wall 433. It is a matter of course that, when the conductive material 405 along the partition wall 433 is electrically connected to the metallic lid 430, only one of the grounding connection pads 464, 465 in FIG. 29 is sufficient as a grounding connection pad which causes the potential of each of the conductive material 405 and the lid 430 to be brought to the grounding potential.

INDUSTRIAL APPLICABILITY

In the multiple-mode piezoelectric filter unit according to the present invention, even though two piezoelectric filters are housed in a single small container to remarkably reduce the mounting area, the ability of preventing the electrode groups from being acoustically and electromagnetically coupled with each other, is higher than that of a conventional piezoelectric filter unit of this type, and the influences of the lines of electric force from the electrode groups are hardly exerted, such that the filter unit is easy in final adjustment and exhibits excellent guarantee attenuation characteristics. Accordingly, the filter unit is particularly useful for a communication device required to be made in a compact design, such as a portable telephone or the like.

What is claimed is:

1. In a multiple-mode piezoelectric filter having a piezoelectric substrate provided on one side thereof with a pair of input/output electrodes with a predetermined gap provided and on the other side thereof with a grounding electrode opposite to the pair of input/output electrodes, said multiple-mode piezoelectric filter characterized in that:

a single container houses two piezoelectric substrates each provided with a pair of input/output electrodes and a grounding electrode; and all the electrodes, or, those except for said grounding electrodes, on said piezoelectric substrates are respectively connected to connection terminals independently formed on said container, wherein the input/output electrodes are respectively guided to diagonally opposed corners of the piezoelectric substrate.

2. A multiple-mode piezoelectric filter according to claim 1, wherein that connection terminal of said container connected to the output electrode on one piezoelectric substrate, is connected, inside of said container, to that connection terminal of said container connected to the input electrode on the other piezoelectric substrate with conductive adhesives or a bonding wire.

3. A multiple-mode piezoelectric filter according to any of claims 1 and 2, wherein said grounding electrodes on said piezoelectric substrates are respectively connected to connection terminals independently formed on said container.

4. A multiple-mode piezoelectric filter according to any of claims 1 or 2, wherein said two piezoelectric substrates are housed in said container with the center line between the input/output electrodes of one pair positionally shifted from the center line between the input/output electrodes of the other pair.

5. In a multiple-mode piezoelectric filter having a piezoelectric substrate provided on one side thereof with a pair of input/output electrodes with a predetermined gap provided and on the other side thereof with a grounding electrode opposite to the pair of input/output electrodes, said multiple-mode piezoelectric filter characterized in that:

two electrode groups each comprising a pair of input/output electrodes and a grounding electrode are formed on a single piezoelectric substrate;

said piezoelectric substrate is a rectangular crystal element and has the sides which do not extend along the x- and z'-axes;

said pairs of input/output electrodes are formed with a gap extending along said x- or z'-axis; and said pairs of input/output electrodes are each connected, by outgoing electrode patterns having the same length, to connection pads formed at sides of said piezoelectric substrate.

6. In a multiple-mode piezoelectric filter having a piezoelectric substrate provided on one side thereof with a pair of input/output electrodes with a predetermined gap provided and on the other side thereof with a grounding electrode opposite to the pair of input/output electrodes, wherein:

two electrode groups each comprising a pair of input/output electrodes and a grounding electrode are formed on a single piezoelectric substrate;

said piezoelectric substrate is connected, between said two pairs of input/output electrodes, to a container with a conductive damping material different in acoustic impedance from said piezoelectric substrate;

said piezoelectric substrate is provided, on its side having said two pairs of input/output electrodes formed thereon, with another grounding electrode for partitioning said two pairs of input/output electrodes; and said another grounding electrode and said container are connected to each other with a material different in acoustic impedance from said piezoelectric substrate.

7. In a multiple-mode piezoelectric filter having a piezoelectric substrate provided on one side thereof with a pair of input/output electrodes with a predetermined gap provided and on the other side thereof with a grounding electrode opposite to the pair of input/output electrodes, wherein:

two electrode groups each comprising a pair of input/output electrodes and a grounding electrode are formed on a single piezoelectric substrate;

said piezoelectric substrate is connected, between said two pairs of input/output electrodes, to a container with a material different in acoustic impedance from said piezoelectric substrate;

said piezoelectric substrate is provided, on its side having said two pairs of input/output electrodes formed thereon, with another grounding electrode for partitioning said two pairs of input/output electrodes;

said another grounding electrode and said container are connected to each other with a material different in acoustic impedance from said piezoelectric substrate;

said another grounding electrode for partitioning said two pairs of input/output electrodes has a pattern which projects toward the center of each of said pairs of input/output electrodes; and the width of each of the projecting portions of said pattern is smaller in the direction toward each of said pairs of input/output electrodes.

8. A multiple-mode piezoelectric filter according to claim 7, wherein said two pairs of input/output electrodes are formed at right angles to each other on said piezoelectric substrate.

9. In a multiple-mode piezoelectric filter having a single container of the surface-mounting type in which there are connected, in cascade, two multiple-mode piezoelectric filter elements comprising at least one piezoelectric substrate and two electrode groups each comprising a pair of input/output electrodes and a grounding electrode, said pairs of input/output electrodes being formed on one side of said piezoelectric substrate with a predetermined gap provided, and said grounding electrodes being formed on the other side of said piezoelectric substrate at positions respectively opposite to said pairs of input/output electrodes, said multiple-mode piezoelectric filter characterized in that:

two pits adjacent to each other are formed in said container;

said piezoelectric substrate is secured to said container at the peripheral portions of said pits with said grounding electrodes turned toward the bottom surfaces of said pits;

a lid made of a conductive material is mounted on said container;

a conductive material is disposed along a partition wall between said two pits such that the upper end of said conductive material reaches a position at least in the vicinity of the underside of said lid; and said conductive material and said lid are connected to a grounding connection terminal formed on said container, wherein said conductive material along said partition wall between said two pits is a conductive material embedded in each of a plurality of through-holes formed in said partition wall between said pits.

10. A multiple-mode piezoelectric filter according to claim 9, wherein each of said two multiple-mode piezoelectric filter elements comprises a piezoelectric substrate and having a respective one of said two electrode groups formed thereon.

11. A multiple-mode piezoelectric filter according to claim 9, wherein said two multiple-mode piezoelectric filter elements comprise a single common piezoelectric substrate and said two electrode groups formed thereon.

12. In a multiple-mode piezoelectric filter having a piezoelectric substrate provided on one side thereof with a pair of input/output electrodes with a predetermined gap provided and on the other side thereof with a grounding electrode opposite to the pair of input/output electrodes wherein;

two electrode groups each comprising a pair of input/output electrodes and a grounding electrode are formed on a single piezoelectric substrate;

there are formed, at a position where said two electrode groups are partitioned, one of a notch, a slot, a plurality of holes, or a groove, said one of said notch, slot and holes passing through said piezoelectric substrate and said groove being formed in at least that side of said piezoelectric substrate on which said pairs of input/output electrodes are being formed; and an elastic material is embedded in said notch, said slot, said plurality of holes or said groove, wherein said two pairs of input output electrodes are formed at right angles to each other on said piezoelectric substrate.

13. A multiple-mode piezoelectric filter according to claim 12, wherein:

said piezoelectric substrate is housed in said container; and said elastic material is connected to said container.

14. A multiple-mode piezoelectric filter according to claim 13, wherein:

said elastic material is a conductive material; and said conductive material is connected to a grounding connection terminal formed on said container.

15. In a multiple-mode piezoelectric filter having a single container of the surface-mounting type in which there are connected, in cascade, two multiple-mode piezoelectric filter elements comprising at least one piezoelectric substrate and two electrode groups each comprising a pair of input/output electrodes and a grounding electrode, said pairs of input/output electrodes being formed on one side of said piezoelectric substrate with a predetermined gap provided, and said grounding electrodes being formed on the other side of said piezoelectric substrate at positions respectively opposite to said pairs of input/output electrodes, said multiple-mode piezoelectric filter characterized in that:

two pits adjacent to each other are formed in said container;

said piezoelectric substrate is secured to said container at the peripheral portions of said pits with said pairs of input/output electrodes turned toward the bottom surfaces of said pits;

each of said bottom surfaces of said pits is covered with a conductive material;

a conductive material is disposed along a partition wall between said two pits;

the grounding electrodes are respectively guided to an edge of the piezoelectric substrate by corresponding outgoing electrode patterns; and said conductive materials are connected to a grounding connection terminal formed on said container.

16. A multiple-mode piezoelectric filter according to claim 15, wherein said two multiple-mode piezoelectric filter elements comprise a single common piezoelectric substrate and said two electrode groups formed thereon.

17. In a multiple-mode piezoelectric filter having a single container of the surface-mounting type in which there are connected, in cascade, two multiple-mode piezoelectric filter elements comprising at least one piezoelectric substrate and two electrode groups each comprising a pair of input/output electrodes and a grounding electrode, said pairs of input/output electrodes being formed on one side of said piezoelectric substrate with a predetermined gap provided, and said grounding electrodes being formed on the other side of said piezoelectric substrate at positions respectively opposite to said pairs of input/output electrodes, said multiple-mode piezoelectric filter characterized in that:

two pits adjacent to each other are formed in said container;

said piezoelectric substrate is secured to said container at the peripheral portions of said pits with said pairs of input/output electrodes turned toward the bottom surfaces of said pits;

each of said bottom surfaces of said pits is covered with a conductive material;

a conductive material is disposed along a partition wall between said two pits; and said conductive materials are connected to a grounding connection terminal formed on said container, wherein said conductive material along said partition wall between said two pits is a conductive material which covers the inner wall surface of each of said pits.

18. A multiple-mode piezoelectric filter according to claim 17, wherein each of said two multiple-mode piezoelectric filter elements comprises a piezoelectric substrate and having a respective one of said two electrode groups formed thereon.

19. A multiple-mode piezoelectric filter according to claim 17, wherein said two multiple-mode piezoelectric filter elements comprise a single common piezoelectric substrate and said two electrode groups formed thereon.

20. In a multiple-mode piezoelectric filter having a single container of the surface-mounting type in which there are connected, in cascade, two multiple-mode piezoelectric filter elements comprising at least one piezoelectric substrate and two electrode groups each comprising a pair of input/output electrodes and a grounding electrode, said pairs of input/output electrodes being formed on one side of said piezoelectric substrate with a predetermined gap provided, and said grounding electrodes being formed on the other side of said piezoelectric substrate at positions respectively opposite to said pairs of input/output electrodes, said multiple-mode piezoelectric filter characterized in that:

two pits adjacent to each other are formed in said container;

said piezoelectric substrate is secured to said container at the peripheral portions of said pits with said grounding electrodes turned toward the bottom surfaces of said pits;

a lid made of a conductive material is mounted on said container;

a conductive material is disposed along a partition wall between said two pits such that the upper end of said conductive material reaches a position at least in the vicinity of the underside of said lid;

the grounding electrodes are respectively guided to an edge of the piezoelectric substrate by corresponding outgoing electrode patterns; and said conductive material and said lid are connected to a grounding connection terminal formed on said container.

21. A multiple-mode piezoelectric filter according to claim 20, wherein each of said two multiple-mode piezoelectric filter elements comprises a piezoelectric substrate and has a respective one of said two electrode groups formed thereon.

22. A multiple-mode piezoelectric filter according to claim 20, wherein said two multiple-mode piezoelectric filter elements comprise a single common piezoelectric substrate and said two electrode groups formed thereon.

23. In a multiple-mode piezoelectric filter having a single container of the surface-mounting type in which there are connected, in cascade, two multiple-mode piezoelectric filter elements comprising at least one piezoelectric substrate and two electrode groups each comprising a pair of input/output electrodes and a grounding electrode, said pairs of input/output electrodes being formed on one side of said piezoelectric substrate with a predetermined gap provided, and said grounding electrodes being formed on the other side of said piezoelectric substrate at positions respectively opposite to said pairs of input/output electrodes, said multiple-mode piezoelectric filter characterized in that:

two pits adjacent to each other are formed in said container;

said piezoelectric substrate is secured to said container at the peripheral portions of said pits with said grounding electrodes turned toward the bottom surfaces of said pits;

a lid made of a conductive material is mounted on said container;

a conductive material is disposed along a partition wall between said two pits such that the upper end of said conductive material reaches a position at least in the vicinity of the underside of said lid; and said conductive material and said lid are connected to a grounding connection terminal formed on said container, wherein said conductive material along said partition wall between said two pits is a conductive material which covers the inner wall surface of each of said pits.

24. A multiple-mode piezoelectric filter according to claim 23, wherein each of said two multiple-mode piezoelectric filter elements comprises a piezoelectric substrate and having a respective one of said two electrode groups formed thereon.

25. A multiple-mode piezoelectric filter according to claim 23, wherein said two multiple-mode piezoelectric filter elements comprise a single common piezoelectric substrate and said two electrode groups formed thereon.

26. In a multiple-mode piezoelectric filter having a single container of the surface-mounting type in which there are connected, in cascade, two multiple-mode piezoelectric filter elements comprising at least one piezoelectric substrate and two electrode groups each comprising a pair of input/output electrodes and a grounding electrode, said pairs of input/output electrodes being formed on one side of said piezoelectric substrate with a predetermined gap provided, and said grounding electrodes being formed on the other side of said piezoelectric substrate at positions respectively opposite to said pairs of input/output electrodes, said multiple-mode piezoelectric filter characterized in that:

two pits adjacent to each other are formed in said container;

said piezoelectric substrate is secured to said container at the peripheral portions of said pits with said grounding electrodes turned toward the bottom surfaces of said pits;

a lid made of a conductive material is mounted on said container;

a conductive material is disposed along a partition wall between said two pits such that the upper end of said conductive material reaches a position at least in the vicinity of the underside of said lid; and said conductive material and said lid are connected to a grounding connection terminal formed on said container, wherein said conductive material along said partition wall between said two pits is a plate-like conductive material inserted in said partition wall between said pits.

27. A multiple-mode piezoelectric filter according to claim 26, wherein each of said two multiple-mode piezoelectric filter elements comprises a piezoelectric substrate and having a respective one of said two electrode groups formed thereon.

28. A multiple-mode piezoelectric filter according to claim 26, wherein said two multiple-mode piezoelectric filter elements comprise a single common piezoelectric substrate and said two electrode groups formed thereon.

29. In a multiple-mode piezoelectric filter having a single container of the surface-mounting type in which there are connected, in cascade, two multiple-mode piezoelectric filter elements comprising at least one piezoelectric substrate and two electrode groups each comprising a pair of input/output electrodes and a grounding electrode, said pairs of input/output electrodes being formed on one side of said piezoelectric substrate with a predetermined gap provided, and said grounding electrodes being formed on the other side of said piezoelectric substrate at positions respectively opposite to said pairs of input/output electrodes, said multiple-mode piezoelectric filter characterized in that:

two pits adjacent to each other are formed in said container;

said piezoelectric substrate is secured to said container at the peripheral portions of said pits with said pairs of input/output electrodes turned toward the bottom surfaces of said pits;

each of said bottom surfaces of said pits is covered with a conductive material;

a conductive material is disposed along a partition wall between said two pits; and said conductive materials are connected to a grounding connection terminal formed on said container, wherein each of said two multiple-mode piezoelectric filter elements comprises a piezoelectric substrate and has a respective one of said two electrode groups formed thereon.

30. In a multiple-mode piezoelectric filter having a single container of the surface-mounting type in which there are connected, in cascade, two multiple-mode piezoelectric filter elements comprising at least one piezoelectric substrate and two electrode groups each comprising a pair of input/output electrodes and a grounding electrode, said pairs of input/output electrodes being formed on one side of said piezoelectric substrate with a predetermined gap provided, and said grounding electrodes being formed on the other side of said piezoelectric substrate at positions respectively opposite to said pairs of input/output electrodes, said multiple-mode piezoelectric filter characterized in that:

two pits adjacent to each other are formed in said container;

said piezoelectric substrate is secured to said container at the peripheral portions of said pits with said pairs of input output electrodes turned toward the bottom surfaces of said pits;

each of said bottom surfaces of said pits is covered with a conductive material;

a conductive material is disposed along a partition wall between said two pits; and said conductive materials are connected to a grounding connection terminal formed on said container, wherein said conductive material along said partition wall between said two pits is a plate-like conductive material inserted in said partition wall between said pits.

31. A multiple-mode piezoelectric filter according to claim 30, wherein said two multiple-mode piezoelectric filter elements comprise a single common piezoelectric substrate and said two electrode groups formed thereon.

32. A multiple-mode piezoelectric filter according to claim 30, wherein each of said two multiple-mode piezoelectric filter elements comprises a piezoelectric substrate and each of said two electrode groups formed thereon.

33. In a multiple-mode piezoelectric filter having a single container of the surface-mounting type in which there are connected, in cascade, two multiple-mode piezoelectric filter elements comprising at least one piezoelectric substrate and two electrode groups having a respectible one each comprising a pair of input/output electrodes and a grounding electrode, said pairs of input/output electrodes being formed on one side of said piezoelectric substrate with a predetermined gap provided, and said grounding electrodes being formed on the other side of said piezoelectric substrate at positions respectively opposite to said pairs of input/output electrodes, said multiple-mode piezoelectric filter characterized in that:

two pits adjacent to each other are formed in said container;

said piezoelectric substrate is secured to said container at the peripheral portions of said pits with said pairs of input/output electrodes turned toward the bottom surfaces of said pits;

each of said bottom surfaces of said pits is covered with a conductive material;

a conductive material is disposed along a partition wall between said two pits; and said conductive materials are connected to a grounding connection terminal formed on said container, wherein said conductive material along said partition wall between said two pits is a conductive material embedded in each of a plurality of through-holes formed in said partition wall between said pits.

34. A multiple-mode piezoelectric filter according to claim 33, wherein each of said two multiple-mode piezoelectric filter elements comprises a piezoelectric substrate and having a respective one of said two electrode groups formed thereon.

35. A multiple-mode piezoelectric filter according to claim 33, wherein said two multiple-mode piezoelectric filter elements comprise a single common piezoelectric substrate and said two electrode groups formed thereon.

each of said bottom surfaces of said pits is covered with a conductive material;

a conductive material is disposed along a partition wall between said two pits; and said conductive materials are connected to a grounding connection terminal formed on said container, wherein each of said two multiple-mode piezoelectric filter elements comprises a piezoelectric substrate and has a respective one of said two electrode groups formed thereon.

* * * * *